US012020948B2

(12) United States Patent
He et al.

(10) Patent No.: US 12,020,948 B2
(45) Date of Patent: Jun. 25, 2024

(54) METHOD FOR IMPROVED POLYSILICON ETCH DIMENSIONAL CONTROL

(71) Applicant: TAIWAN SEMICONDUCTOR MANUFACTURING COMPANY, LTD., Hsinchu (TW)

(72) Inventors: Yun-Jui He, Hsinchu (TW); Chih-Teng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/377,634

(22) Filed: Jul. 16, 2021

(65) Prior Publication Data
US 2023/0024640 A1 Jan. 26, 2023

(51) Int. Cl.
| | | |
|---|---|---|
| H01L 21/3213 | (2006.01) | |
| G03F 1/70 | (2012.01) | |
| G06F 30/39 | (2020.01) | |

(52) U.S. Cl.
CPC .......... *H01L 21/32137* (2013.01); *G03F 1/70* (2013.01); *G06F 30/39* (2020.01); *H01L 21/32139* (2013.01)

(58) Field of Classification Search
None
See application file for complete search history.

(56) References Cited

U.S. PATENT DOCUMENTS

| | | | |
|---|---|---|---|
| 6,063,710 A * | 5/2000 | Kadomura | H01L 21/32137 438/715 |
| 6,444,084 B1 * | 9/2002 | Collins | H01J 37/32458 216/68 |
| 7,260,442 B2 | 8/2007 | Hwang et al. | |
| 9,256,709 B2 | 2/2016 | Yu et al. | |
| 9,666,715 B2 * | 5/2017 | Chang | H01L 29/785 |
| 2014/0040838 A1 | 2/2014 | Liu et al. | |
| 2015/0278429 A1 | 10/2015 | Chang | |
| 2016/0343862 A1 * | 11/2016 | Chang | H01L 21/32137 |

* cited by examiner

*Primary Examiner* — Stephanie P Duclair
(74) *Attorney, Agent, or Firm* — Hauptman Ham, LLP

(57) ABSTRACT

Provided are methods of manufacturing integrated circuit that include a polysilicon etch process in which the wafer having an etch poly pattern is loaded into a reactor chamber and exposed to an activated etchant and, during the etch process, adjusting the temperature conditions within the reactor chamber to increase polymeric deposition on an upper surface of the wafer.

20 Claims, 10 Drawing Sheets

METHOD FOR IMPROVED POLYSILICON ETCH DIMENSIONAL CONTROL

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. As the semiconductor industry has progressed into nanometer technology process nodes in pursuit of higher device density, higher performance, and lower costs, challenges from both fabrication and design issues have resulted in the development of three-dimensional designs.

The semiconductor integrated circuit (IC) industry has experienced rapid growth. Technological advances in IC materials and design have produced generations of ICs with each generation having smaller and more complex circuits than the previous generation. However, as the semiconductor industry has progressed into nanometer technology process nodes in pursuit of higher device density, higher performance, and lower costs, the challenges in both fabrication and design of such devices has resulted in the development of three-dimensional designs including, for example, the fin field effect transistor (FinFET).

Although advantages of the FinFET include reducing short channel effects and increasing current flow, the associated fabrication processes continue to become more challenging as the feature sizes and the spacings between features continue to decrease.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
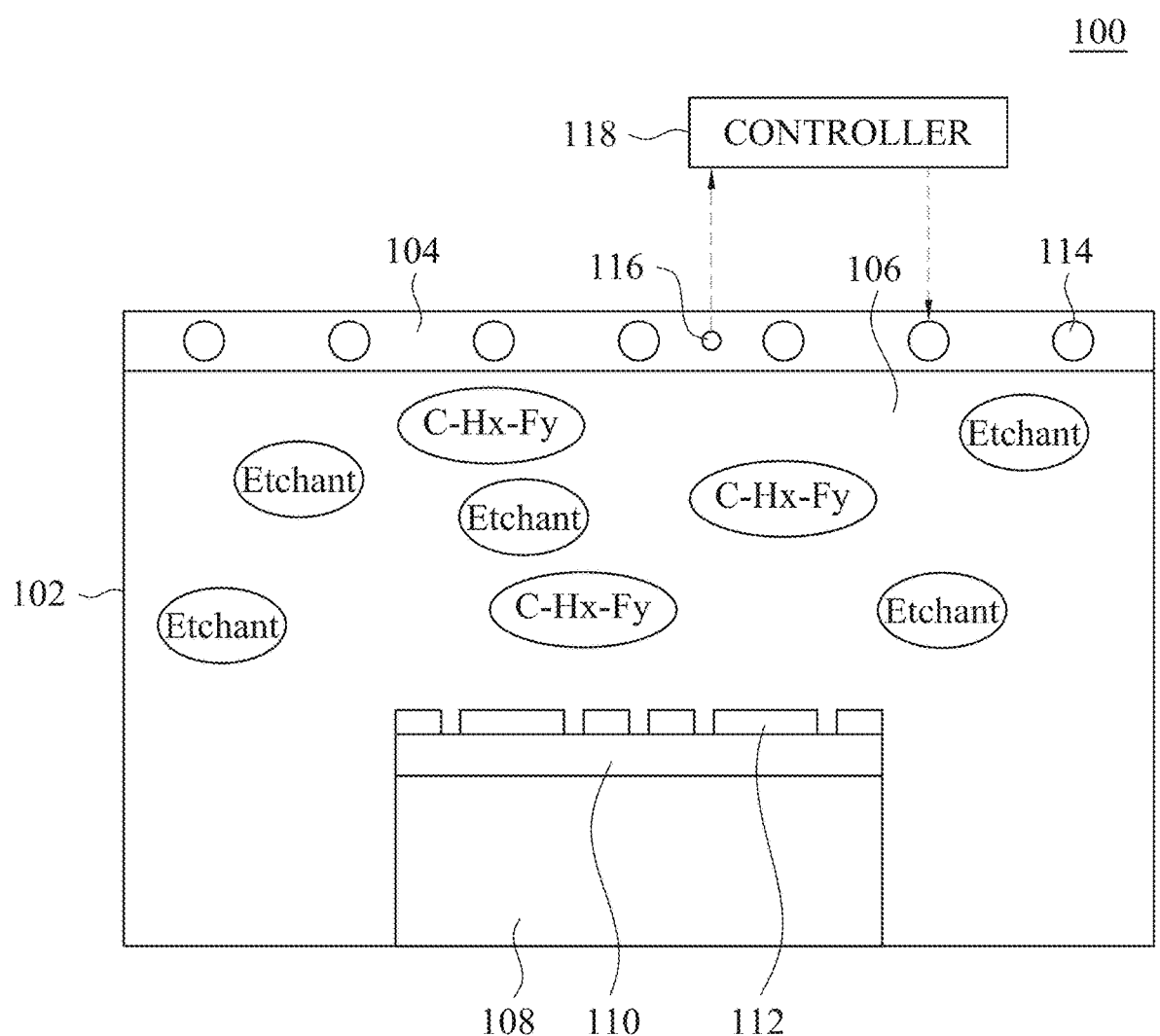
FIG. 1 is a cross-sectional view of an etching tool useful in manufacturing a FinFET device structure according to some embodiments.

This description of the exemplary embodiments is intended to be read in connection with the accompanying drawings, which are to be considered part of the entire written description. The following disclosure provides many different embodiments, or examples, for implementing different features of the provided subject matter. The drawings are not to scale and the relative sizing and placement of structures have been modified for clarity rather than dimensional accuracy. Specific examples of components, values, operations, materials, arrangements, or the like, are described below to simplify the present disclosure.

These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "vertical," "horizontal," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus and structures may be otherwise oriented (rotated by, for example, 90°, 180°, or mirrored about a horizontal or vertical axis) and the spatially relative descriptors used herein may likewise be interpreted accordingly.

The structures and methods detailed below relate generally to the structures, designs, and manufacturing methods for IC devices, including fin field effect transistor (FinFET) devices. Although the structures and methods will be discussed in terms of FinFET devices, the structures and methods are not so limited and are suitable for inclusion in manufacturing processes for other classes of IC devices.

In FinFET devices, the mobility performance is influenced by both the epitaxial (EPI) volume and the associated device topography which, in turn, is dependent on the strained source drain (SSD) profile. Embodiments of the disclosed methods, by providing improved control of the SSD profile through control of the etch chamber conditions, will tend to reduce manufacturing defects while improving device mobility and performance.

In particular, the deviations in the sizing of the photoresist (PR) post-etch openings as determined at the after etch inspection (AEI) are indicative of the likelihood and nature of associated defects. If the post-etch photoresist (PR) opening is larger than the manufacturing target, there is an increased likelihood of over etch-related damage to the device. Conversely, if the post-etch PR opening is smaller than the manufacturing target, there is an increased likelihood of incomplete or partial etching defects. Further, in some current manufacturing processes, epitaxial (EPI) volume and topography control usually involve adjustments to the EPI deposition recipe in order to achieve a target growth rate which, in turn, negatively affect the EPI tool productivity and/or the final EPI composition in some instances. Variations in the final EPI composition and configuration will tend to degrade and/or increase the variability of the performance of the resulting IC device.

FIG. 1 is a cross-sectional view of an etching tool 100 useful in the manufacture of a FinFET device structure according to some embodiments. In some embodiments, the etching tool 100 comprises a chamber wall 102, which, in combination with a chamber lid 104, encloses a functional chamber volume 106 into which the etchant(s) will be introduced. In some embodiments, the chamber lid 104 will include a heating apparatus 114 for increasing the temperature of the chamber lid 104 above the ambient temperature $T_a$ or a base operating temperature $T_b$ (when there is self-heating from the etch process that increases the temperature of the chamber lid 104 above the ambient temperature $T_a$) to reach a target polymerization temperature $T_p$ range. In some embodiments, the chamber lid 104 includes a temperature sensor 116 for monitoring the temperature of the chamber lid 104.

In some embodiments, the temperature sensor 116 will transfer temperature data to a controller 118 that will, in turn, control the power applied to the heating apparatus 114 in order to maintain the temperature of the chamber lid 104 within a predetermined temperature range. Although, as shown, in some embodiments the heating apparatus 114 will be incorporated into the chamber lid 104 including, for example, resistive heating elements or channels through which a heated working fluid is forced and at least one temperature sensor for generating a signal used by a controller for controlling the additional heating provided by the heating apparatus. In other embodiments the heating apparatus 114 will be provided on the lower surface of the chamber lid 104 or at other positions within the functional chamber volume 106, including, for example radiant heating elements, resistive heating elements, or tubing through which a heated working fluid is forced, and at least one temperature sensor for generating a signal used by a controller for controlling the additional heating provided by the heating apparatus. The heating apparatus 114 is positioned in order to apply radiant heating to the surface of the wafer 110 and the etch pattern 112 provided on the wafer 110. Similarly, although as shown, in some embodiments the temperature sensor 116 will be incorporated into the chamber lid 104, in some other embodiments the temperature sensor 116 (or sensors) will be positioned within the functional chamber volume 106 in order to monitor the temperature of the chamber lid 104 and/or the amount of radiant heating being applied to the surface of the wafer 110 and the etch pattern 112 provided thereon.

In some embodiments, a wafer support 108 is arranged and configured to hold a wafer 110 within the functional chamber volume 106 of etching tool 100 during the etching process. Additional mechanisms including, for example, tracks, stages, elevators, arms, and/or guides (not shown) usable for removing the wafer 110 from a carrier or track (not shown) and positioning the wafer 110 on the wafer support 108 are included. The same or other additional mechanisms including, for example, tracks, stages, elevators, arms, and/or guides (not shown) usable after the etch process has been completed for removing the wafer from the wafer support 108 and transferring the wafer 110 to a carrier (not shown), track, or other transport apparatus for movement to the next step in the manufacturing process are included.

During the etching process, one or more etchant species are introduced into the functional chamber volume 106 as a plasma or other activated species and applied to the exposed surfaces of the wafer 110. In some embodiments, the etchant will include one or more halogen compounds including, for example, $CF_4$, $Cl_2$, and/or $HBr$, that will remove the material or materials on the wafer 110 that are exposed by etch pattern 112. In addition to removing material from the exposed surfaces, the etchant(s) will also interact with the materials used to form the etch pattern 112. In some embodiments, when photoresist (PR) is used in forming a portion of the etch pattern 112, the interaction with the etchant(s) will product polymeric compounds of varying stoichiometry which can be represented by the formula $C-H_x-F_x$ (in which F is one or more halogen species).

Figure 2A:
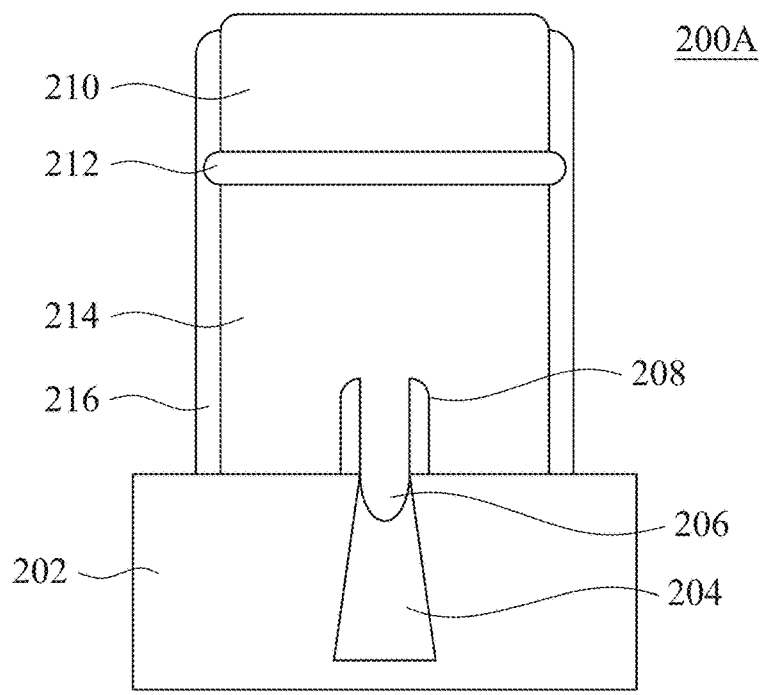
FIGS. 2A and 2B are cross-sectional views at an intermediate step in the manufacture of a FinFET device structure according to some embodiments.
Figure 2B:
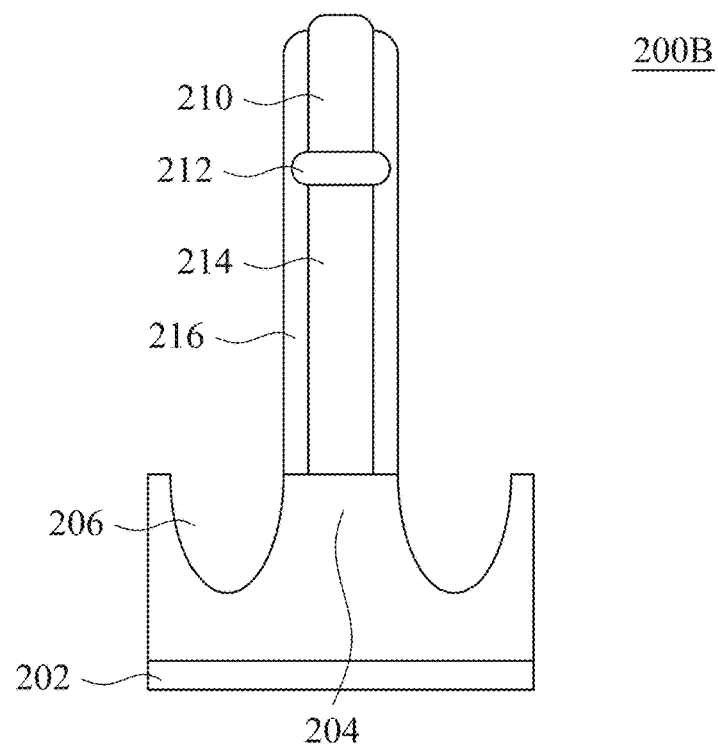

FIGS. 2A and 2B are cross-sectional views of a FinFET structure at an intermediate step in the manufacture of a FinFET device. The FinFET structures 200A and 200B, in which the cross-sectional views are offset by 90°, each include a substrate 202, a fin structure 204, a strained source/drain (SSD) recess 206, fin sidewalls 208, an etch mask 210, an etch stop layer 212, e.g., silicon nitride (SiN), polysilicon 214, and sidewalls 216. FIGS. 2A and 2B represent a FinFET structure that has been manufactured without the benefit of the embodiments of the methods and structures disclosed below.

Figure 3A:
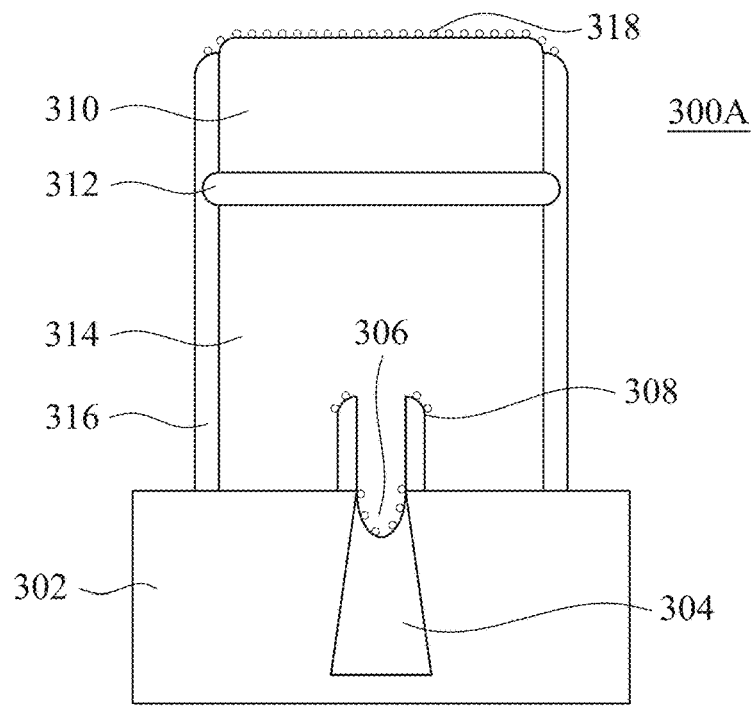
FIGS. 3A and 3B are cross-sectional views at an intermediate step in the manufacture of a FinFET device structure according to some embodiments.
Figure 3B:
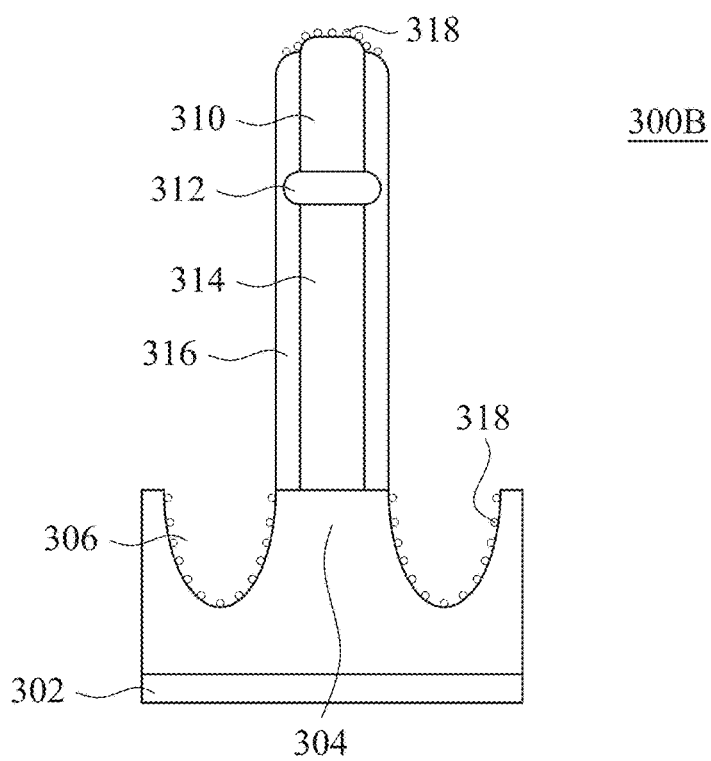

FIGS. 3A and 3B are cross-sectional views of a FinFET structure at an intermediate step in the manufacture of a FinFET device. The FinFET structures 300A and 300B, in which the cross-sectional views are offset by 90°, each include a substrate 302, a fin structure 304, a strained source/drain (SSD) recess 306, fin sidewalls 308, an etch mask 310, an etch stop layer 312, e.g., silicon nitride (SiN), polysilicon 314, and sidewalls 316. FIGS. 3A and 3B represent a FinFET structure that has been manufactured with full benefit of the embodiments of the methods and structures disclosed below.

In some embodiments, the temperature of the chamber lid 104 is increased above a base operating temperature $T_b$ (the chamber lid temperature resulting from performing the etch process without supplemental heating of the chamber lid) to a polymerizing temperature $T_p$ at which the polymeric compounds represented by the formula $C-H_x-F_x$ (in which F is one or more halogen species) will be preferentially or increasingly deposited on the more horizontal surfaces of wafer 110 to form polymeric deposits 318 as the etch process progresses. In some embodiments, these polymeric deposits 318, will be found on the exposed surface of the strained source/drain (SSD) recess 306, the upper surfaces of the fin sidewalls 308, the etch mask 310, and the upper surfaces of the sidewalls 316. Without being bound by theory, the inventors believe that these polymeric deposits 318 provide additional protection to the exposed surface of the strained source/drain (SSD) recess 306 and the etch mask 310 during the etch process, thereby suppressing over-etch and undercutting modalities.

The temperature difference between the base operating temperature $T_b$ and the polymerizing temperature $T_p$ will vary as a function of factors including, for example, one or more of the plasma etch chemistry, the plasma energy, the reactor pressure, the photoresist composition and thickness, and the correlation between the increased temperature of the heat source, e.g., the reactor chamber lid and/or supplemental heating elements, and the temperature increase at the upper surface of the wafer. In some embodiments, reactor chamber lid temperature increases of, for example, as little as 3 to 5° C. are sufficient to induce increased polymer formation and to suppress poly etch pattern erosion and thereby reducing etch damage to sensitive structures. In other embodiments, the temperature difference between the base operating temperature $T_b$ and the higher polymerizing temperature $T_p$ will be greater than 5° C. in order to induce a degree of polymerization sufficient to suppress poly etch pattern erosion and better maintain the patterned dimensions, and thereby reduce etch-induced damage to structures protected by the poly etch pattern.

With respect to the exposed surface of the strained source/drain (SSD) recess 306, the additional protection provided by the polymeric deposits 318 formed in some embodiments reduces both the width and depth of the strained source/drain (SSD) recess 306. With respect to the etch mask 310, the additional protection provided by the polymeric deposits 318 formed in some embodiments reduces the etch-induced erosion of the etch mask 310 and reduces the width of the resulting pattern opening, thereby improving the dimensional performance, improving etch mask 310 sidewall retention, and decreasing the likelihood of etch-induced damage, to improve both the width and depth of the strained source/drain (SSD) recess 306.

Figure 4A:
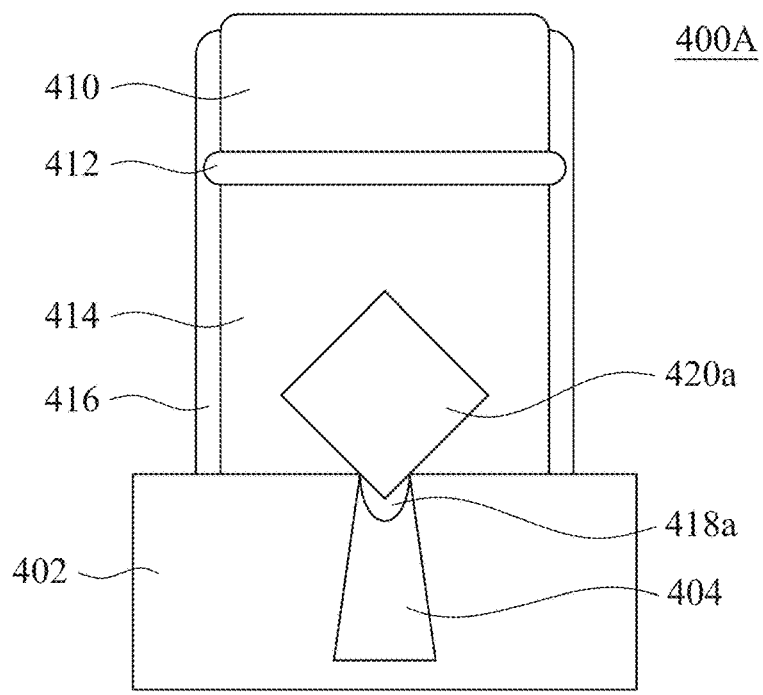
FIGS. 4A and 4B are cross-sectional views at an intermediate step in the manufacture of a FinFET device structure according to some embodiments.
Figure 4B:
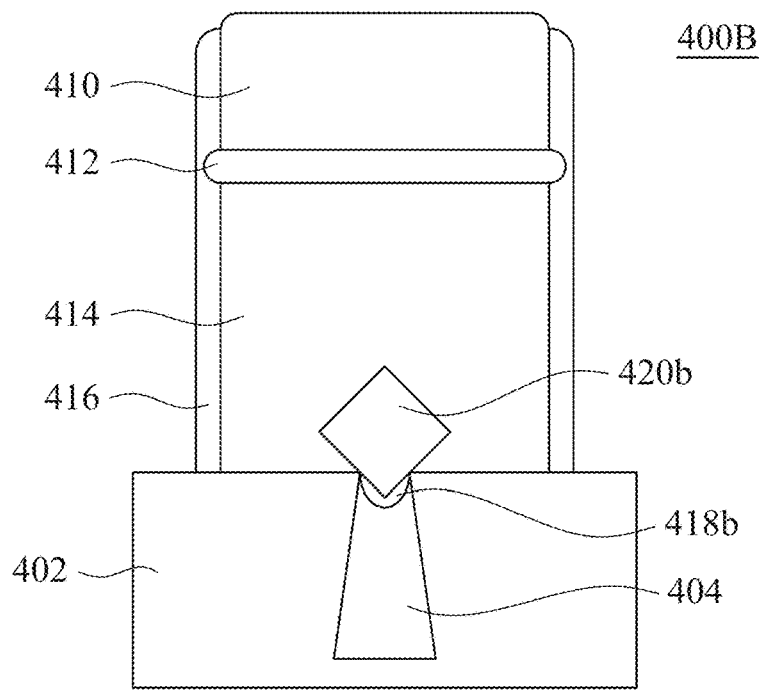

FIGS. 4A and 4B are cross-sectional views of a FinFET structure at an intermediate step in the manufacture of a FinFET device. The FinFET structure 400A corresponds to FinFET structure 200A in FIG. 2A after a first EPI structure 418a is formed to fill a lower portion of SSD recess 206 after which a second EPI structure 420a is formed. Structure 400B corresponds to FinFET structure 300A in FIG. 3A after a first EPI structure 418b is formed to fill a lower portion of SSD recess 306 after which a second EPI structure 420b is formed. Each of the structures 400A and 400B include a substrate 402, a fin structure 404, and first 418a, 418b and second 420a, 420b EPI structures grown from the exposed surfaces of the strained source/drain (SSD) recesses 206, 306 shown in FIGS. 2A and 3A, an etch pattern 410, an etch stop layer 412, e.g., silicon nitride (SiN), polysilicon 414, and sidewalls 416.

FIG. 4A is a FinFET structure 400A that has been manufactured without the benefit of the embodiments of the methods and structures herein and, consequently, even using the same etch pattern 410 and etch process, tends to have a deeper strained source/drain (SSD) recess 206. Consequently, FinFET structure 400A has a second EPI structure 420a grown from the first EPI structure 418a which was grown from the exposed surfaces of the strained source/drain (SSD) recess 206 that is larger and has a less controlled geometry/topography.

FIG. 4B is a FinFET structure 400B that has been manufactured with full benefit of the embodiments of the methods and structures herein and, consequently, even using the same etch pattern 410 and etch process, tends to have a shallower strained source/drain (SSD) recess 306. Consequently, FinFET structure 400B has a second EPI structure 420b grown from the exposed surfaces of the first EPI structure 418b that was grown from the exposed surfaces of strained source/drain (SSD) recess 306 that is smaller and has a more controlled geometry/topography. This increased control of the etching process, and the corresponding improvement in the EPI structure 420b when compared with the EPI structure 420a with respect to EPI volume and geometry/topography, tends to improve both the manufacturing yield and performance of finished IC devices manufactured according to some embodiments.

Figure 5:
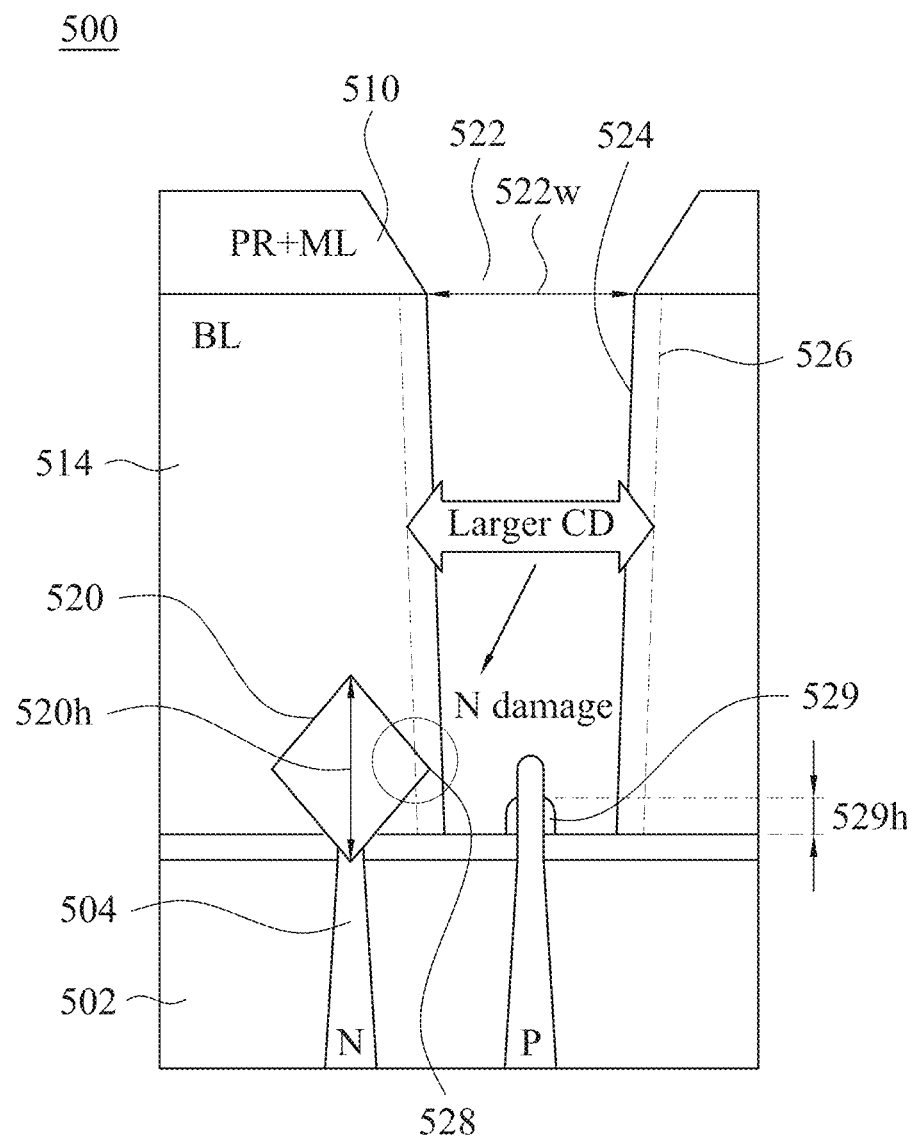
FIG. 5 is a cross-sectional view of a FinFET device structure according to some embodiments.

FIG. 5 is a cross-sectional view of a FinFET device structure 500 at an intermediate step of manufacturing having a lack of control of the dimension of the pattern opening according to some embodiments. As shown in FIG. 5, the structure 500 includes a substrate 502, a fin structure 504, a bottom layer (BL) 514, an EPI structure 520 grown from the exposed surfaces of the strained source/drain (SSD) recesses 206, 306 shown in FIGS. 2A and 3A. As also shown in FIG. 5, the structure 500 includes an etch mask 510, that exposes a portion of a top surface of the BL 514, which is then etched to form opening 522, with a residual portion of the BL 514 protecting the EPI structure 520 during the etch process.

FIG. 5 also indicates a first opening sidewall profile 524 obtained using some embodiments in which the sidewall overetch is suppressed to reduce the likelihood that the EPI structure will be affected by the etch process. FIG. 5 also indicates, with a dashed line, a potential second opening sidewall 526 profile that would result from excessive sidewall etch resulting from undercutting of the etch mask 510 during the etch process which produces a wider opening 522. If the etch mask 510 is undercut, the wider opening tends to reduce or eliminate the portion of the BL 514 that is protecting the EPI structure 520. The loss of this covering will lead to the exposure, or near exposure, of a portion of the EPI structure 520, thereby exposing the EPI structure 520 to damage at a region 528. Damage to the region 528 of the EPI structure 520 results from the diffused or direct exposure of the region 528 to increasing levels of the etchant gases as the protective portions of bottom layer 514 matter are removed from first opening sidewall profile 524 during the etch process.

As illustrated in FIGS. 3A and 3B, the polymeric deposits 318 reduce the erosion of the etch mask 310, 510 and reduce the etch-induced increase in the dimensions of opening 522. When the etch-induced erosion of the etch mask 310, 510 causes an increase in the dimensions of the opening, the thickness of the pattern material protecting other structures is reduced, increasing the likelihood that the etchant will damage or otherwise degrade such structure. When such etch damage occurs, the manufacturing yield, performance, and/or the reliability of the resulting IC devices will be compromised. Accordingly, protecting the pattern dimensions and maintaining the pattern opening dimensions for the duration of the etch process will tend to improve the manufacturing yield, performance, and/or the reliability of the resulting IC devices.

Figure 6:
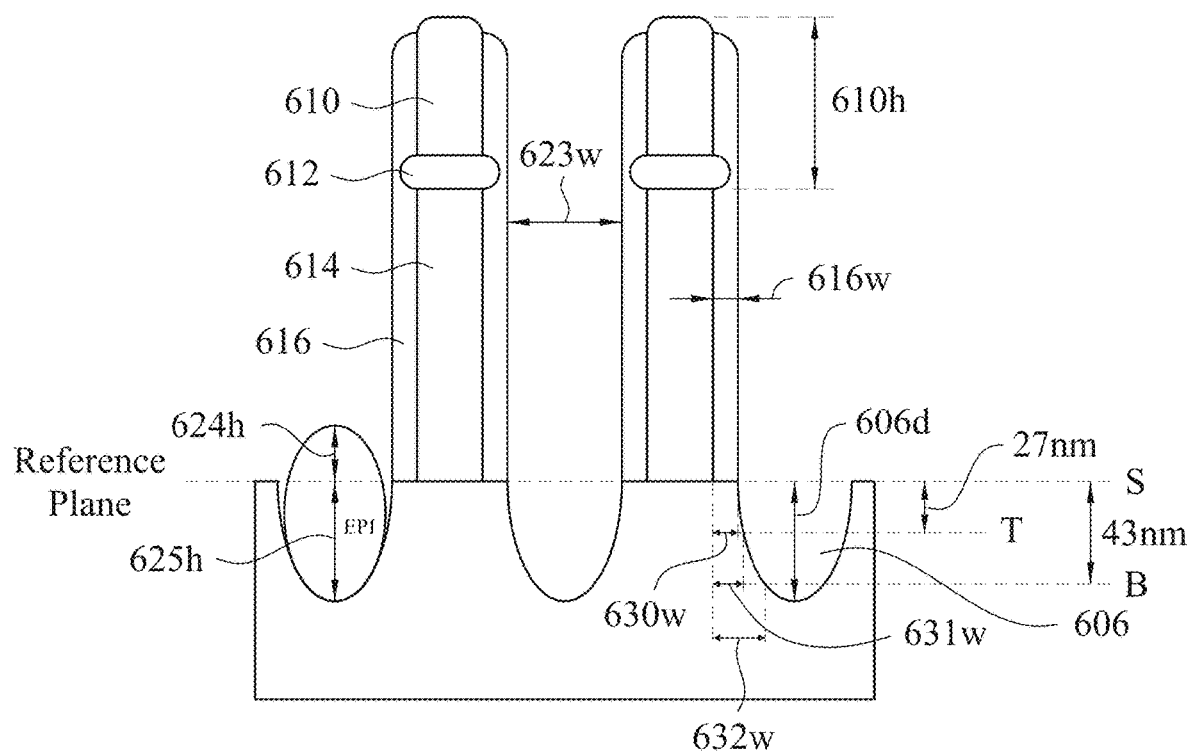
FIG. 6 is a cross-sectional view of a FinFET device structure according to some embodiments with relevant dimensions marked.

FIG. 6 is a cross-sectional view of a FinFET device structure 600 according to some embodiments with certain dimensions marked. In particular, monitored dimensions include the Proximity (the offset between the poly 614 sidewall and the sidewall of the recess 606 measured at the surface (S), the tip (T) (measured 27 nm below the surface/reference plane (or about 50% of the total depth)), and the bottom (B) (measured 43 nm below the surface/reference plane (or about 80% of the total depth to provide improved repeatability in the measurement)). Other monitored dimensions include the dummy sidewall (DSW) thickness 616w, the hard mask (HM) height 610h, the fin sidewall (FSW) height 529h (FIG. 5), the strained source drain (SSD) Depth:spacing ratio, 606d:623w, Proximity (T) measured in input/output (IO) regions, the photoresist (PR) opening 522 (FIG. 5), the strained source drain (SSD) Depth 606ds (in SRAM regions), the EPI Height 624h, and the EPI Depth 625h and the Total EPI (624h+625h) and 520h (FIG. 5).

Departures from the target values for these dimensions will tend to degrade the yield, performance, and/or reliability for the resulting IC devices. RO Recess Depth values that are above or below the target values are associated with reduced manufacturing yields. Proximity values that are above or below the target values are associated with reduced manufacturing yields and values below the target values are associated with reduced breakdown voltage ($V_{BD}$) performance. DSW and HM values that are above or below the target values are associated with disrupted epi growth and reduced epi quality. FSW values that are above or below the target values are associated with reduced dimensional control of the subsequent epi deposition. Variations in the depth:spacing ratio(s) are also associated with increased device performance variability.

In some embodiments, when manufacturing N7 node FinFET devices using a SSD process, a range of target parameters are used for achieving the predetermined dimensions. The 7 nm foundry node utilizes a variety of patterning technologies including one or more of pitch splitting, self-aligned patterning, and EUV lithography. Each of these technologies is capable of being used for providing critical dimension (CD) control and pattern placement for producing the corresponding IC devices. Pitch splitting involves splitting (or separating) pattern features that are too close together to pattern consistently onto different masks with the plurality of masks then being exposed sequentially. Accurate alignment of the plurality of masks and the consistency of the exposure provide the necessary CD control across the multiple exposures.

Representative dimensions for certain of the structures and structural relationships are provided below in Table 1.

better controlling the SSD recess depth, the subsequent EPI growth process can more quickly fill the enlarged strained source/drain (SSD) recess.

Figure 7:
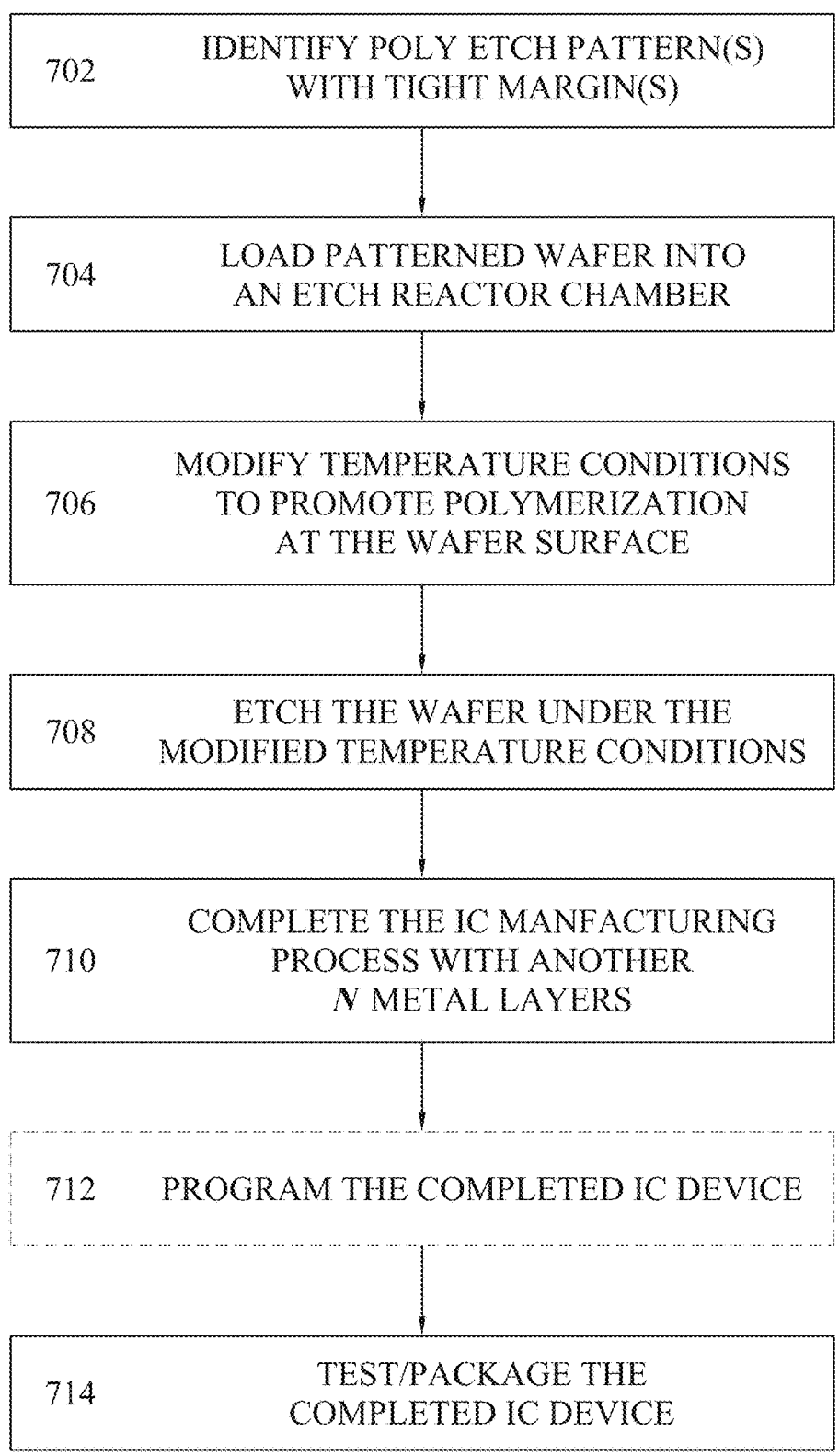
FIG. 7 is a flowchart of a method of manufacturing a FinFET device according to some embodiments.

FIG. 7 is a flowchart of a method 700 of manufacturing an IC device according to some embodiments of the method that comprise a sequential series of operations including an optional operation 702 involving the identification of poly etch patterns that have tight or challenging margins and/or spacing using an IC layout design. At operation 704, a wafer bearing a poly etch pattern, e.g., see FIGS. 3A and 4B, is loaded into the etch reactor chamber. At operation 706, the temperature and, in some embodiments, one or more other process conditions, e.g., plasma energy, plasma flowrate, chamber pressure, etchant gas mixture, are set in a manner that will promote formation and deposition of one or more polymeric species on the exposed surfaces of the wafer, e.g., see FIG. 1.

At operation 708, after the predetermined process conditions have been obtained, the wafer is etched to remove at least a portion of the polysilicon/silicon material exposed by the poly etch pattern, e.g., see FIG. 3A, recess 306. At operation 710, the remainder of the manufacturing operations are performed to obtain a functional IC device, including, for example, epitaxial growth of a first layer of semiconductor material, e.g., see FIG. 6, 620p, followed by the epitaxial growth if a second semiconductor structure, e.g., see FIG. 4A, 420. Additional operations include the deposition, patterning, and etching of a plurality of metal layer patterns (not shown), the interlayer dielectric (ILD) materials that separate the metal patterns, and the via and/or contact openings provided through the ILD layers that provide for predetermined electrical connections between

TABLE 1

| Element/Dimension | MTS NSSD | MTS PSSD | Ref Nos. |
|---|---|---|---|
| RO Recess Depth | 59 nm | 56 nm | 606 dr (in the RO region) |
| Proximity (S) | 7 nm | 7 nm | S: 630 w (at Ref Plane) |
| Proximity (T) | 7 nm | 3 nm | T: 631 w (27 nm below Ref Plane) |
| Proximity (B) | 9 nm | 9 nm | B: 632 w (43 nm below Ref Plane) |
| DSW CD | 7 nm | 7 nm | 616 w |
| HMHT | >50 nm | >50 nm | 610 h |
| FSW Height | 12.5 nm | 12.5 nm | 529 h |
| SSD Depth/Spacing Ratio | <1:1 | <1:1 | 623 w : 606 ds |
| IO Proximity (T) | >10 nm | >9 nm | Proximity (T) in 10 region |
| PR Opening Width (nm) | Target-1.5 nm | | 522 w |
| SSD Depth | 50-52 nm | | 606 ds (in the SRAM region) |
| EPI Recess Height | 5~6 nm | | 624 h |
| EPI Depth | 30.5~31.5 nm | | 625 h |
| Total EPI | 35.5~37.5 nm | | 520 h |

By utilizing embodiments of the disclosed method, a number of improvements are obtained over the standard poly etch processing including, for example, increased control over the width of the opening formed in the poly etch mask (specifically the photoresist portion) indicating the reduced pattern undercut experienced when polymeric deposits formed on the exposed surfaces of the poly etch pattern, e.g., silicon oxide/photoresist, that results in a smaller opening extending through the polysilicon. According to some embodiments, the SSD depth has improved control, thereby reducing the risk of defects associated with over-etched and/or enlarged strained source/drain (SSD) recess 306 regions that will tend to complicate and/or degrade the subsequent EPI growth process. Further, by the various metal patterns. Depending on the purpose and configuration of the functional IC device, at optional operation 712 the IC device can be programmed. At optional operation 714, the completed (and optionally programmed) IC device is subjected to a functional test, to evaluate operation of the IC device according to IC design parameters corresponding to the device under test (DUT) including, for example, function, speed, and reliability, and packaged (and/or packaged and then tested) before delivery to a customer.

Figure 8:
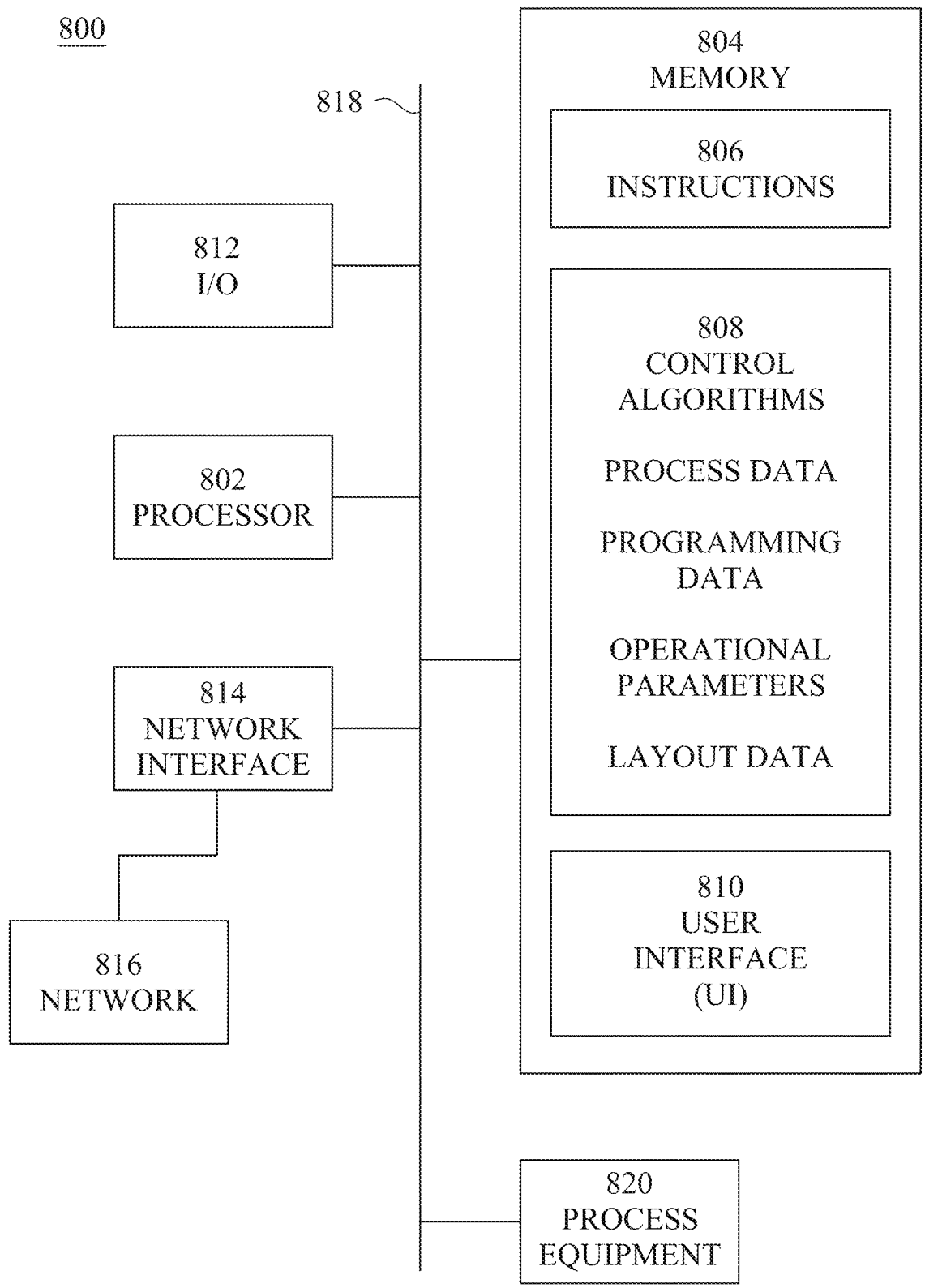
FIG. 8 is a schematic diagram of a system for manufacturing FinFET devices according to some embodiments.

FIG. 8 is a block diagram of an electronic process control (EPC) system 800, in accordance with some embodiments. Methods used for generating cell layout diagrams corresponding to some embodiments of the FinFET structures detailed above, particularly with respect to the addition and placement of the field plate contact on the RPO structure are implementable, for example, using EPC system 800, in accordance with some embodiments of such systems. In some embodiments, EPC system 800 is a general purpose computing device including a hardware processor 802 and a non-transitory, computer-readable, storage medium 804. Computer-readable storage medium 804, amongst other things, is encoded with, i.e., stores, computer program code (or instructions) 806, i.e., a set of executable instructions. Execution of computer program code 806 by hardware processor 802 represents (at least in part) an EPC tool which implements a portion or all of, e.g., the methods described herein in accordance with one or more (hereinafter, the noted processes and/or methods).

Hardware processor 802 is electrically coupled to computer-readable storage medium 804 via a bus 818. Hardware processor 802 is also electrically coupled to an I/O interface 812 by bus 818. A network interface 814 is also electrically connected to hardware processor 802 via bus 818. Network interface 814 is connected to a network 816, so that hardware processor 802 and computer-readable storage medium 804 are capable of connecting to external elements via network 816. Hardware processor 802 is configured to execute computer program code 806 encoded in computer-readable storage medium 804 in order to cause EPC system 800 to be usable for performing a portion or all of the noted processes and/or methods. In one or more embodiments, hardware processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, computer-readable storage medium 804 stores computer program code 806 configured to cause the EPC system 800 (where such execution represents (at least in part) the EPC tool) to be usable for performing a portion or all of the noted processes and/or methods. In one or more embodiments, computer-readable storage medium 804 also stores information which facilitates performing a portion or all of the noted processes and/or methods. In one or more embodiments, computer-readable storage medium 804 stores process control data 808 including, in some embodiments, control algorithms, process variables and constants, target ranges, set points, programming control data, and code for enabling statistical process control (SPC) and/or model predictive control (MPC) based control of the various processes.

EPC system 800 includes I/O interface 812. I/O interface 812 is coupled to external circuitry. In one or more embodiments, I/O interface 812 includes a keyboard, keypad, mouse, trackball, trackpad, touchscreen, and/or cursor direction keys for communicating information and commands to hardware processor 802.

EPC system 800 also includes network interface 814 coupled to hardware processor 802. Network interface 814 allows EPC system 800 to communicate with network 816, to which one or more other computer systems are connected. Network interface 814 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 800.

EPC system 800 is configured to send information to and receive information from fabrication tools 820 that include one or more of ion implant tools, etching tools, deposition tools, coating tools, rinsing tools, cleaning tools, chemical-mechanical planarizing (CMP) tools, testing tools, inspection tools, transport system tools, and thermal processing tools that will perform a predetermined series of manufacturing operations to produce the desired integrated circuit devices. The information includes one or more of operational data, parametric data, test data, and functional data used for controlling, monitoring, and/or evaluating the execution, progress, and/or completion of the specific manufacturing process. The process tool information is stored in and/or retrieved from computer-readable medium 804.

EPC system 800 is configured to receive information through I/O interface 812. The information received through I/O interface 812 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 802. The information is transferred to hardware processor 802 via bus 818. EPC system 800 is configured to receive information related to a user interface (UI) through I/O interface 812. The information is stored in computer-readable medium 804 as user interface (UI) 810.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 800.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
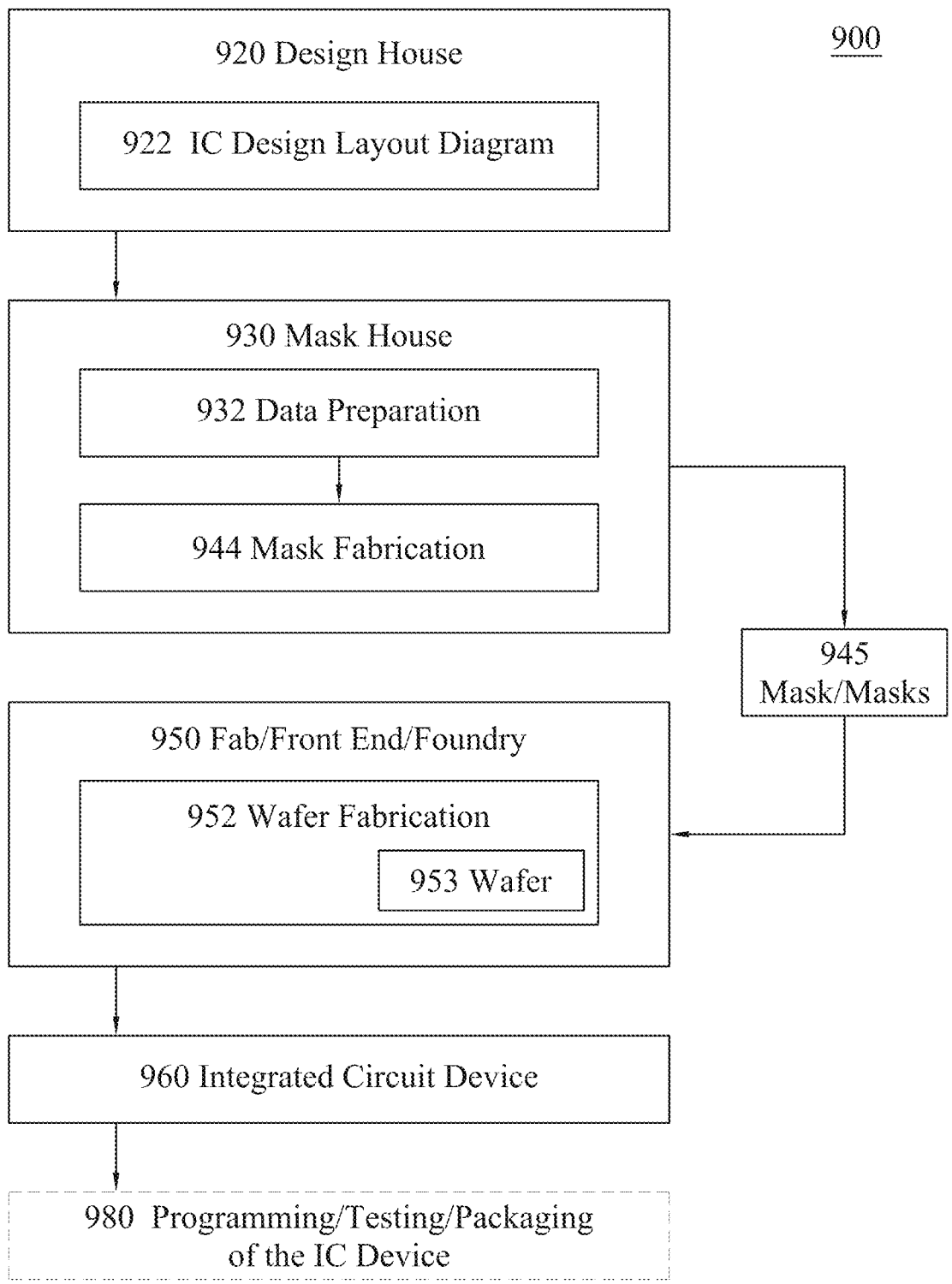
FIG. 9 is a flowchart of IC device design, manufacture, and programming of IC devices according to some embodiments.

FIG. 9 is a block diagram of an integrated circuit (IC) manufacturing system 900, and an IC manufacturing flow associated therewith, in accordance with some embodiments for manufacturing IC devices that incorporate the improved control over the SSD and EPI profile. In some embodiments, based on a layout diagram, at least one of (A) one or more semiconductor masks or (B) at least one component in a layer of a semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. Once the manufacturing process has been completed to form a plurality of IC devices on a wafer, the wafer is sent to backend or back end of line (BEOL) for, depending on the device, programming, electrical testing, and packaging in order to obtain the final IC device products. The entities in manufacturing system 900 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 920, mask house 930, and IC Fab 950 is owned by a single larger company. In some embodiments, two or more of design house 920, mask house 930, and IC Fab 950 coexist in a common facility and use common resources.

Design house (or design team) 920 generates an IC design layout diagram 922. IC design layout diagram 922 includes various geometrical patterns designed for an IC device 960. The geometrical patterns correspond to patterns of metal, oxide, or semiconductor layers that make up the various components of IC device 960 to be fabricated. The various layers combine to form various IC features.

For example, a portion of IC design layout diagram 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout diagram 922. The design procedure includes one or more of logic design, physical design or place and route. IC design layout diagram 922 is presented in one or more data files having information of the geometrical patterns. For example, IC design layout diagram 922 can be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 930 includes mask data preparation 932 and mask fabrication 944. Mask house 930 uses IC design layout diagram 922 to manufacture one or more masks 945 to be used for fabricating the various layers of IC device 960 according to IC design layout diagram 922. Mask house 930 performs mask data preparation 932, where IC design layout diagram 922 is translated into a representative data file ("RDF"). Mask data preparation 932 provides the RDF to mask fabrication 944. Mask fabrication 944 includes a mask writer. A mask writer converts the RDF to an image on a substrate, such as a mask (reticle) 945 or a semiconductor wafer 953. The IC design layout diagram 922 is manipulated by mask data preparation 932 to comply with particular characteristics of the mask writer and/or requirements of IC Fab 950. In FIG. 9, mask data preparation 932 and mask fabrication 944 are illustrated as separate elements. In some embodiments, mask data preparation 932 and mask fabrication 944 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout diagram 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout diagram 922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 922 to compensate for limitations during mask fabrication 944, which may undo part of the modifications performed by OPC in order to meet mask creation rules.

In some embodiments, mask data preparation 932 includes lithography process checking (LPC) that simulates processing that will be implemented by IC Fab 950 to fabricate IC device 960. LPC simulates this processing based on IC design layout diagram 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 922.

It should be understood that the above description of mask data preparation 932 has been simplified for the purposes of clarity. In some embodiments, mask data preparation 932 includes additional features such as a logic operation (LOP) to modify the IC design layout diagram 922 according to manufacturing rules. Additionally, the processes applied to IC design layout diagram 922 during mask data preparation 932 may be executed in a variety of different orders.

After mask data preparation 932 and during mask fabrication 944, a mask 945 or a group of masks 945 are fabricated based on the modified IC design layout diagram 922. In some embodiments, mask fabrication 944 includes performing one or more lithographic exposures based on IC design layout diagram 922. In some embodiments, an electron-beam (e-beam) or a mechanism of multiple e-beams is used to form a pattern on a mask (photomask or reticle) 945 based on the modified IC design layout diagram 922. Mask 945 can be formed in various technologies. In some embodiments, mask 945 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 945 includes a transparent substrate (e.g., fused quartz) and an opaque material (e.g., chromium) coated in the opaque regions of the binary mask.

In another example, mask 945 is formed using a phase shift technology. In a phase shift mask (PSM) version of mask 945, various features in the pattern formed on the phase shift mask are configured to have proper phase difference to enhance the resolution and imaging quality. In various examples, the phase shift mask can be attenuated PSM or alternating PSM. The mask(s) generated by mask fabrication 944 is used in a variety of processes. For example, such a mask(s) is used in an ion implantation process to form various doped regions in semiconductor wafer 953, in an etching process to form various etching regions in semiconductor wafer 953, and/or in other suitable processes.

IC Fab 950 includes wafer fabrication 952. IC Fab 950 is an IC fabrication business that includes one or more manufacturing facilities for the fabrication of a variety of different IC products. In some embodiments, IC Fab 950 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 952 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 945 include a single layer of mask material. In some embodiments, a mask 945 includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, areas not covered by the mask, e.g., fins in open areas of the pattern, are etched to modify a dimension of one or more structures within the exposed area(s). In some embodiments, the etching is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, etching processes include presenting the exposed structures in the functional area(s) in an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures may include the fin structures of Fin Field Effect Transistors (FinFET) with the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC Fab 950 uses mask(s) 945 fabricated by mask house 930 to fabricate IC device 960. Thus, IC Fab 950 at least indirectly uses IC design layout diagram 922 to fabricate IC device 960. In some embodiments, semiconductor wafer 953 is fabricated by IC Fab 950 using mask(s) 945 to form IC device 960. In some embodiments, the IC fabrication includes performing one or more lithographic exposures based at least indirectly on IC design layout diagram 922. Semiconductor wafer 953 includes a silicon substrate or other proper substrate having material layers formed thereon. Semiconductor wafer 953 further includes one or more of various doped regions, dielectric features, multi-level interconnects, and the like (formed at subsequent manufacturing steps).

Thus, IC Fab 950 at least indirectly uses IC design layout diagram 922 to fabricate IC device 960. In some embodiments, semiconductor wafer 953 is fabricated by IC Fab 950 using mask(s) 945 to form IC device 960. In some embodiments, the IC fabrication includes performing one or more lithographic exposures based at least indirectly on IC design layout diagram 922. Semiconductor wafer 953 includes a silicon substrate or other proper substrate having material layers formed thereon. Semiconductor wafer 953 further includes one or more of various doped regions, dielectric features, multilevel interconnects, and the like (formed at subsequent manufacturing steps).

Details regarding an integrated circuit (IC) manufacturing system (e.g., manufacturing system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, each of which are hereby incorporated, in their entireties, by reference.

Figure 10:
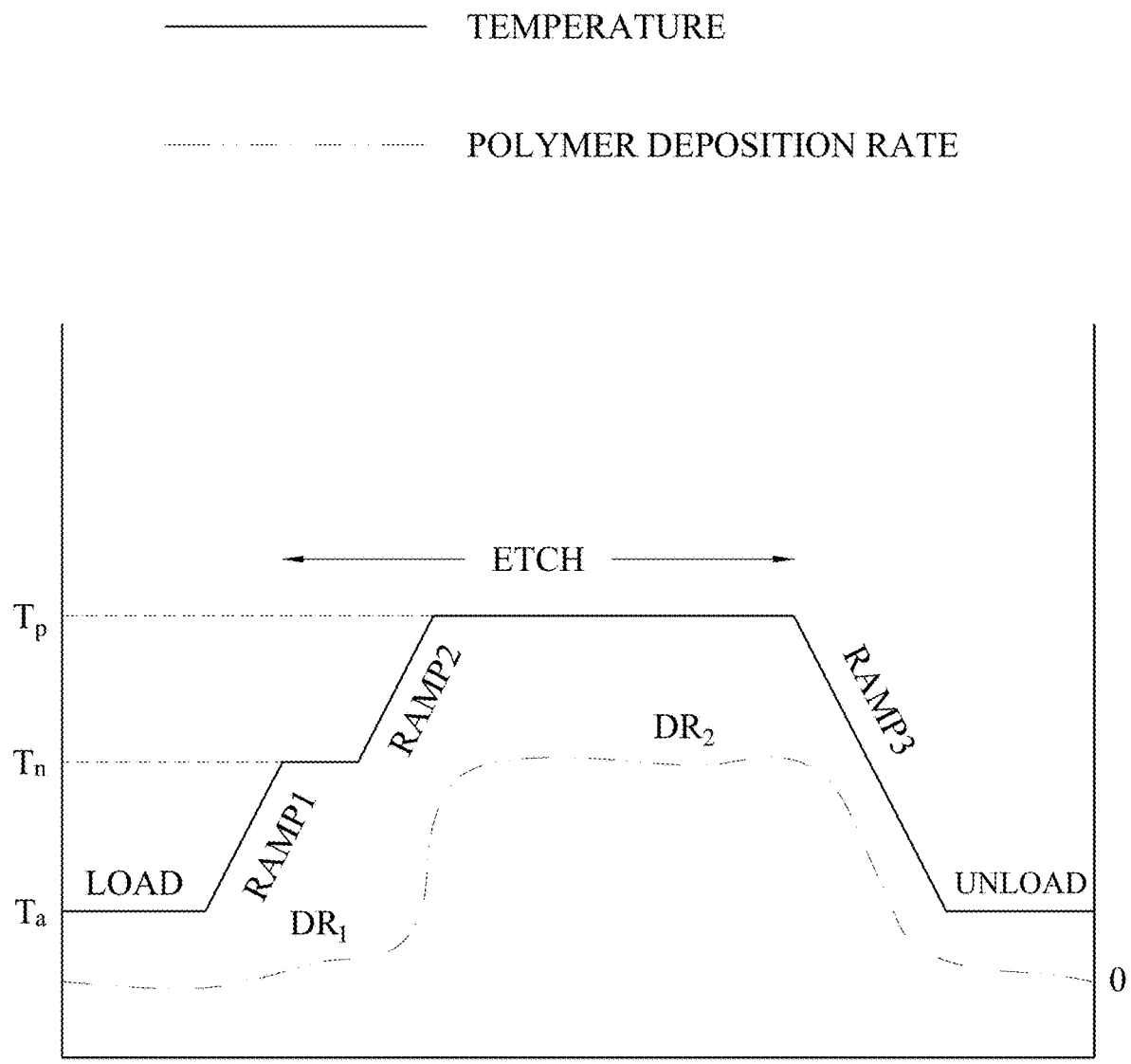
FIG. 10 is a chart of an etch process according to some embodiments.

FIG. 10 illustrates an etch process according to some embodiments of the method. A wafer is loaded into an etch reactor chamber at an ambient temperature $T_a$, e.g., the room temperature of the fabrication area, LOAD, and heated RAMP1, to a nominal etch temperature $T_n$, at which point a first portion of etch process ETCH is initiated. At the nominal etch temperature, the deposition rate for polymerization products onto an upper surface of the wafer $DR_1$, is relatively low. The temperature within the etch reactor chamber is then increased to a polymerization temperature $T_p$ RAMP2 in order to increase the deposition rate of polymerization products onto an upper surface of the wafer $DR_2$ during at least a portion of the etch process, with $DR_2 >> DR_1$. The additional polymerization products induced by etching at the polymerization temperature $T_p$ aid in the control of critical dimensions for the structures being etched into the upper surface of the wafer and tend to reduce the likelihood of damage to existing structures. Once the etch process has been completed, the wafer is cooled to near ambient temperature RAMP3 before being discharged for the next manufacturing operation UNLOAD.

Methods for manufacturing an integrated circuit according to some embodiments include loading a wafer having a polysilicon etch pattern into a reactor chamber, exposing the wafer to an activated etchant within the reactor chamber for a first portion of an etch period to remove polysilicon and form a recess under a nominal reactor temperature $T_n$, the nominal reactor temperature inducing a first polymeric deposition rate $DR_1$ on an upper surface of the wafer, and heating the reactor chamber to establish a polymerization temperature $T_p$ within the reactor chamber during a second portion of the etch period, the polymerization temperature inducing an increased second polymeric deposition rate $DR_2$ on the upper surface of the wafer, wherein $DR_2$ is greater than $DR_1$.

Methods for manufacturing an integrated circuit according to other embodiments include one or more additional operations including, for example, forming the activated etchant from the group of etchant gases containing at least one halogen atom, forming the activated etchant from the group of etchant gases consisting of $CF_4$, $Cl_2$, HBr, and mixtures thereof, heating a reactor chamber lid to establish the polymerization temperature $T_p$ within the reactor chamber, establishing the polymerization temperature $T_p$ of at least 3° C. above a base reactor chamber lid operating temperature $T_b$, establishing the polymerization temperature $T_p$ at least 5° C. above a base reactor chamber lid operating temperature $T_b$, growing a first epitaxial semiconductor on an exposed surface of the epitaxial recess and growing a second epitaxial semiconductor on an exposed surface of the first epitaxial semiconductor, setting the polymerization temperature $T_p$ at least 5° C. above a base radiant heating assembly operating temperature $T_{bR}$ and/or setting the polymerization temperature using radiant heating from a radiant heating assembly located within the reactor chamber.

Methods for manufacturing an integrated circuit according to some embodiments include retrieving an IC design layout diagram from a memory device, analyzing the IC design layout diagram for a poly etch spacing below a target value, and modifying a wafer fabrication process to include an enhanced poly etch process for IC design layout diagrams in which the poly etch spacing is below the target value, with the enhanced poly etch process including the operations of exposing the wafer to an activated etchant within the reactor chamber for a first portion of an etch cycle to remove polysilicon and form a recess under a nominal reactor temperature $T_n$, the nominal reactor temperature inducing a first polymeric deposition rate $DR_1$ on an upper surface of the wafer, and heating the reactor chamber to establish a polymerization temperature $T_p$ within the reactor chamber during a second portion of the etch cycle, the polymerization temperature inducing an increased second polymeric deposition rate $DR_2$ on the upper surface of the wafer, wherein $DR_2$ is at least 200% of $DR_1$.

Methods for manufacturing an integrated circuit according to other embodiments include one or more additional operations including, for example, selecting an etchant gas from the group of etchant gases consisting of $CF_4$, $Cl_2$, HBr, and mixtures thereof, heating a reactor chamber lid to a polymerization temperature $T_p$ and thereby establish the temperature condition within the reactor chamber, setting the polymerization temperature $T_p$ at least 5° C. above a base reactor chamber lid operating temperature $T_b$, measuring the polymerization temperature $T_p$ at a central region of the reactor chamber lid, and/or using an embodiment of the method to manufacture a FinFET device.

Systems for manufacturing an integrated circuit according to some embodiments include a first deposition apparatus arranged and configured for depositing sidewall material adjacent a polysilicon structure on an upper surface of a wafer, a first etch apparatus arranged and configured for etching the sidewall material to form a sidewall adjacent the polysilicon structure, a first coating apparatus arranged and configured for depositing a photosensitive material over the polysilicon structure and the sidewall, a first patterning apparatus arranged and configured for exposing a predetermined portions of the photosensitive material, a first developing apparatus arranged and configured for removing a portion of the photosensitive material to form a poly etch pattern on the photosensitive material and thereby expose a portion of the polysilicon structure, a first etching apparatus arranged and configured for etching the exposed portion of the polysilicon structure, the duration of the etching being sufficient to remove a portion of the exposed polysilicon structure and form an epitaxial recess in the wafer, and a temperature controlled etch chamber lid provided on the first etching apparatus for establishing and maintaining an elevated polymerization temperature within an etch chamber during a portion of the etching and thereby increase a polymer deposition rate on the surface of the wafer.

Systems for manufacturing an integrated circuit according to some other embodiments incorporate one or more additional elements including, for example, a first epitaxial deposition apparatus arranged and configured for growing a first epitaxial semiconductor structure from a surface of the epitaxial recess; a first etching apparatus arranged and configured for utilizing an etchant gas selected from the group of etchant gases consisting of $CF_4$, $Cl_2$, HBr, and mixtures thereof, a deposition control apparatus associated with the first epitaxial deposition apparatus, the deposition control apparatus being arranged and configured for establishing a ratio between a depth of the first epitaxial semiconductor structure and an epitaxial recess height of less than a predetermined value, e.g., less than 6, and/or a second epitaxial deposition apparatus arranged and configured for establishing growing a second epitaxial semiconductor structure from a surface of the first epitaxial semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing an integrated circuit comprising:
   loading a wafer having a polysilicon etch pattern into a reactor chamber;
   exposing the wafer to an activated etchant within the reactor chamber for a first portion of an etch period to remove polysilicon and form a recess under a nominal reactor temperature $T_n$, the nominal reactor temperature inducing a first polymeric deposition rate $DR_1$ on an upper surface of the wafer; and
   heating the reactor chamber to establish a polymerization temperature $T_P$ within the reactor chamber during a second portion of the etch period, the polymerization temperature inducing an increased second polymeric deposition rate $DR_2$ on the upper surface of the wafer, wherein $DR_2$ is greater than $DR_1$.

2. The method of manufacturing an integrated circuit according to claim 1, further comprising:
   forming the activated etchant from the group of etchant gases containing at least one halogen atom.

3. The method of manufacturing an integrated circuit according to claim 1 further comprising:
   forming the activated etchant from the group of etchant gases consisting of $CF_4$, $Cl_2$, HBr, and mixtures thereof.

4. The method of manufacturing an integrated circuit according to claim 1, further comprising:
   heating a reactor chamber lid to establish the polymerization temperature $T_P$ within the reactor chamber.

5. The method of manufacturing an integrated circuit according to claim 4, further comprising:
   establishing the polymerization temperature $T_P$ of at least 3° C. above a base reactor chamber lid operating temperature $T_b$.

6. The method of manufacturing an integrated circuit according to claim 4, further comprising:
   establishing the polymerization temperature $T_P$ at least 5° C. above a base reactor chamber lid operating temperature $T_b$.

7. The method of manufacturing an integrated circuit according to claim 1, further comprising:
   growing a first epitaxial semiconductor on an exposed surface of the epitaxial recess; and
   growing a second epitaxial semiconductor on an exposed surface of the first epitaxial semiconductor.

8. The method of manufacturing an integrated circuit according to claim 7, further comprising:
   setting the polymerization temperature $T_P$ at least 5° C. above a base radiant heating assembly operating temperature $T_{bR}$.

9. The method of manufacturing an integrated circuit according to claim 7 further comprising:
   setting the polymerization temperature using radiant heating from a radiant heating assembly located within the reactor chamber.

10. A method of manufacturing an integrated circuit comprising:
    retrieving an IC design layout diagram from a memory device;
    analyzing the IC design layout diagram for a poly etch spacing below a target value; and
    modifying a wafer fabrication process to include an enhanced poly etch process for IC design layout diagrams in which the poly etch spacing is below the target value,
        wherein the enhanced poly etch process includes
            exposing the wafer to an activated etchant within the reactor chamber for a first portion of an etch cycle to remove polysilicon and form a recess under a nominal reactor temperature $T_n$, the nominal reactor temperature inducing a first polymeric deposition rate $DR_1$ on an upper surface of the wafer; and
            heating the reactor chamber to establish a polymerization temperature $T_P$ within the reactor chamber during a second portion of the etch cycle, the polymerization temperature inducing an increased second polymeric deposition rate $DR_2$ on the upper surface of the wafer, wherein $DR_2$ is at least 200% of $DR_1$.

11. The method of manufacturing an integrated circuit according to claim 10, further comprising:
    selecting an etchant gas from the group of etchant gases consisting of $CF_4$, $Cl_2$, HBr, and mixtures thereof.

12. The method of manufacturing an integrated circuit according to claim 10, further comprising:
    heating a reactor chamber lid to a polymerization temperature $T_P$ and thereby establish the temperature condition within the reactor chamber.

13. The method of manufacturing an integrated circuit according to claim 12, further comprising:
    setting the polymerization temperature $T_P$ at least 5° C. above a base reactor chamber lid operating temperature $T_b$.

14. The method of manufacturing an integrated circuit according to claim 12, further comprising:
    measuring the polymerization temperature $T_P$ at a central region of the reactor chamber lid.

15. The method of manufacturing an integrated circuit according to claim 12 wherein:
    the integrated circuit is a FinFET.

16. A method for manufacturing an integrated circuit comprising:
    forming a polysilicon structure;
    depositing a sidewall material layer over the polysilicon structure;
    etching the sidewall material layer to form a sidewall adjacent the polysilicon structure;
    depositing a photosensitive material over the polysilicon structure and the sidewall;
    exposing predetermined portions of the photosensitive material;
    removing the predetermined portions of the photosensitive material to form a poly etch pattern that exposes a portion of the polysilicon structure;
    etching a first portion of the exposed portion of the polysilicon structure to form a first portion of a recess in the wafer under etch conditions that produce a first polymer deposition rate ($DR_1$) wherein $DR_1>0$ on an upper surface of the wafer; and
    etching a second portion of the exposed portion of the polysilicon structure to form a second portion of the recess under etch conditions that produce a second polymer deposition rate ($DR_2$) on the upper surface of the wafer, wherein the first and second polymer deposition rates satisfy a relationship $DR_1<DR_2$.

17. The method according to claim 16, further comprising:

growing a first epitaxial semiconductor structure from a surface of the recess.

18. The method according to claim 17, further comprising:

controlling the first epitaxial deposition to establish a first thickness of a first portion of the epitaxial deposition ($ET_1$) filling the recess and to establish a second thickness of a second portion of the first epitaxial deposition ($ET_2$) that extends above a plane defined by a top edge of the recess, wherein the first and second thickness have a ratio $ET_1:ET_2$ that is less than 6:1.

19. The method according to claim 17, further comprising:

growing a second epitaxial semiconductor structure from a surface of the first epitaxial semiconductor structure.

20. The method according to claim 16, further comprising:

etching the exposed portion of the polysilicon structure utilizing an etchant gas selected from the group of etchant gases consisting of $CF_4$, $Cl_2$, HBr, and mixtures thereof.

* * * * *